(12) United States Patent
Hathaway et al.

(10) Patent No.: US 11,189,773 B2
(45) Date of Patent: Nov. 30, 2021

(54) SUPERCONDUCTOR THERMAL FILTER

(71) Applicants: Aaron A. Hathaway, Baltimore, MD (US); Robert M. Young, Ellicott City, MD (US); John X. Przybysz, Severna Park, MD (US); Greg Boyd, Washington, DC (US); Zachary Keane, Baltimore, MD (US)

(72) Inventors: Aaron A. Hathaway, Baltimore, MD (US); Robert M. Young, Ellicott City, MD (US); John X. Przybysz, Severna Park, MD (US); Greg Boyd, Washington, DC (US); Zachary Keane, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 205 days.

(21) Appl. No.: 16/554,155

(22) Filed: Aug. 28, 2019

(65) Prior Publication Data

US 2021/0066571 A1    Mar. 4, 2021

(51) Int. Cl.
*H01L 39/22* (2006.01)
*F25B 21/02* (2006.01)
(Continued)

(52) U.S. Cl.
CPC ............ *H01L 39/223* (2013.01); *F25B 21/02* (2013.01); *H01L 39/12* (2013.01);
(Continued)

(58) Field of Classification Search
CPC ....... H01L 39/12; H01L 39/223; H01L 39/22; H01L 39/2493; H01L 39/025; F25B 21/02; F25B 2321/003; F25B 2400/15
See application file for complete search history.

(56) References Cited

U.S. PATENT DOCUMENTS 5,974,806 A * 11/1999 Pekola ............... H01L 35/225
136/203
6,581,387 B1   6/2003 Ullom
(Continued)

FOREIGN PATENT DOCUMENTS

JP      H1041558 A      2/1998
WO    2017115008 A1    7/2017

OTHER PUBLICATIONS

International Search Report for Application No. PCT/US2020/043394 dated Oct. 29, 2020.
(Continued)

*Primary Examiner* — Joseph F Trpisovsky
(74) *Attorney, Agent, or Firm* — Tarolli, Sundheim, Covell & Tummino LLP

(57) ABSTRACT

A superconductor thermal filter is disclosed that includes a normal metal layer having a first side, an insulating layer overlying the first side of the normal metal layer, and a multilayer superconductor structure having a first side overlying a side of the insulating layer opposite the side that overlies the normal metal layer. The multilayer superconductor structure is comprised of a plurality of superconductor layers with each superconductor layer having a smaller superconducting energy band gap than the preceding superconductor as the superconductor layers extend away from the normal metal layer. The thermal filter further includes a normal metal layer quasiparticle trap having a first side and a second side with the first side being disposed on a second side of the multilayer superconductor. A bias voltage is applied between the normal metal layer and the normal metal layer quasiparticle trap to remove hot electrons from the normal metal layer.

20 Claims, 5 Drawing Sheets

(51) Int. Cl.
*H01L 39/12* (2006.01)
*H01L 39/24* (2006.01)

(52) U.S. Cl.
CPC .... *H01L 39/2493* (2013.01); *F25B 2321/003* (2013.01); *F25B 2400/15* (2013.01)

(56) References Cited

U.S. PATENT DOCUMENTS 8,301,214 B1 10/2012 Tolpygo et al.
2021/0063060 A1 3/2021 Young et al.

OTHER PUBLICATIONS

Herve Courtois et al: "High-performance electronic cooling with superconducting tunnel junctions", Comptes Rendus—Physique., vol. 17, No. 10, Dec. 1, 2016 (Dec. 1, 2016), pp. 1139-1145, XP055738239, FR ISSN: 1631-0705, DOI: 10.1016/j.crhy.2016.08. 010 p. 1141, line 31—p. 1144, line 4; figure 2(d).

HQ Nguyen et al: "A robust platform cooled by superconducting electronic refrigerators", Appl. Phys. Lett. Appl. Phys. Lett, Jan. 1, 2015 (Jan. 1, 2015), pp. 12601-12601, XP055738241, Retrieved from the Internet: URL:https://aip.scitation.org/doi/pdf/10.1063/1. 4905440 p. 1, right-hand column, line 8—p. 2, right-hand column, line 29; figure 1.

Nguyen HQ et al: "A cascade electronic refrigerator using superconducting tunnel junctions", arxiv.org, Cornell University Library, 201 Olin Library Cornell University Ithaca, NY 14853, May 3, 2016 (May 3, 2016), XP080699075, figure 1.

Ian Jasper Agulo et al: "Effective electron microrefrigeration by superconductor-insulator-normal metal tunnel junctions with advanced geometry of electrodes and normal metal traps; Effective electron microrefrigeration by SIN tunnel junctions with advanced geometry of electrodes and normal metal traps", Nanotechnology, Institute of Physics Publishing, GB, vol. 15, No. 4, Apr. 1, 2004 (Apr. 1, 2004), pp. S224-S228, XP020067898, ISSN: 0957-4484, DOI: 10.1088/ 0957-4484/15/4/020 figures 1,2.

Camarasa-Gomez M et al: "Superconducting cascade electron refrigerator", Applied Physics Letters, A I P Publishing LLC, US, vol. 104, No. 19, May 12, 2014 (May 12, 2014), XP012185456, ISSN: 0003-6951, DOI: 10.1063/1.4876478 [retrieved on Jan. 1, 1901] the whole document.

International Search Report for Application No. PCT/US2020/ 043398 dated Nov. 12, 2020.

Clark A M et al: "Practical electron-tunneling refrigerator", Applied Physics Letters, A I P Publishing LLC, US, vol. 84, No. 4, Jan. 26, 2004 (Jan. 26, 2004), pp. 625-627, XP012061945, ISSN: 0003-6951, DOI: 10.1063/1.1644326 figure 1.

Leoni R et al: "Electron cooling by arrays of submicron tunnel junctions", Journal of Applied Physics, American Institute of Physics, US, vol. 85, No. 7, Apr. 1, 1999 (Apr. 1, 1999), pp. 3877-3881, XP012047026, ISSN: 0021-8979, DOI: 10.1063/1.369759 figures 2,3.

Prest M J et al: "Strain enhanced electron cooling in a degenerately doped semiconductor", Applied Physics Letters, A I P Publishing LLC, US, vol. 99, No. 25, Dec. 19, 2011 (Dec. 19, 2011), pp. 251908-251908, XP012152781, ISSN: 0003-6951, DOI: 10.1063/ 1.3670330 [retrieved on Dec. 22, 2011].

Quarnta O et al. "Cooling electrons from 1 K to 400 mK with V-based nanorefrigerators" arxiv.org, Cornell University Library, 201 Olin Library Cornell University Ithaca, NY 14853, Nov. 2, 2010, XP080460092, DOI: 10.1063/1.3544058, figure 1.

International Search Report for Application No. PCT/US2020/ 053789 dated Jan. 15, 2021.

Muhonen, et al.: "Micrometer-Scale Refrigerators"; (2012); Reports on progress in physics. Physical Society (Great Britain). 75. 046501. 10.1088/0034-4885/75/4/046501; found on the internet at: file:/// C:/Users/lpringle/Downloads/Micrometre-scale_refrigerators.pdf on Aug. 28, 2019.

Nguyen, et al. 1: "A Cascade Electronic Refrigerator Using Superconducting Tunnel Junctions" (May 3, 2016) Phys. Rev. Applied 6, 054011 (2016); DOI: 10.1103/PhysRevApplied.6. 054011; arXiv:1605.00830 [cond-mat.mes-hall]; found on the internet at: https://arxiv.org/abs/1605.00830 on Aug. 28, 2019.

Nguyen, et al. 2: "Trapping Hot Quasi-Particles in a High-Power Superconducting Electronic Cooler"; New Journal of Physics. 15. 10.1088/1367-2630/15/8/065013; found on the internet at: https:// www.researchgate.net/publication/236124442_Trapping_hot_quasi-particles_in_a_high-power_superconducting_electronic_cooler, on Aug. 28, 2019.

International Search Report for Application No. PCT/US2020/ 061700 dated Mar. 1, 2021.

* cited by examiner

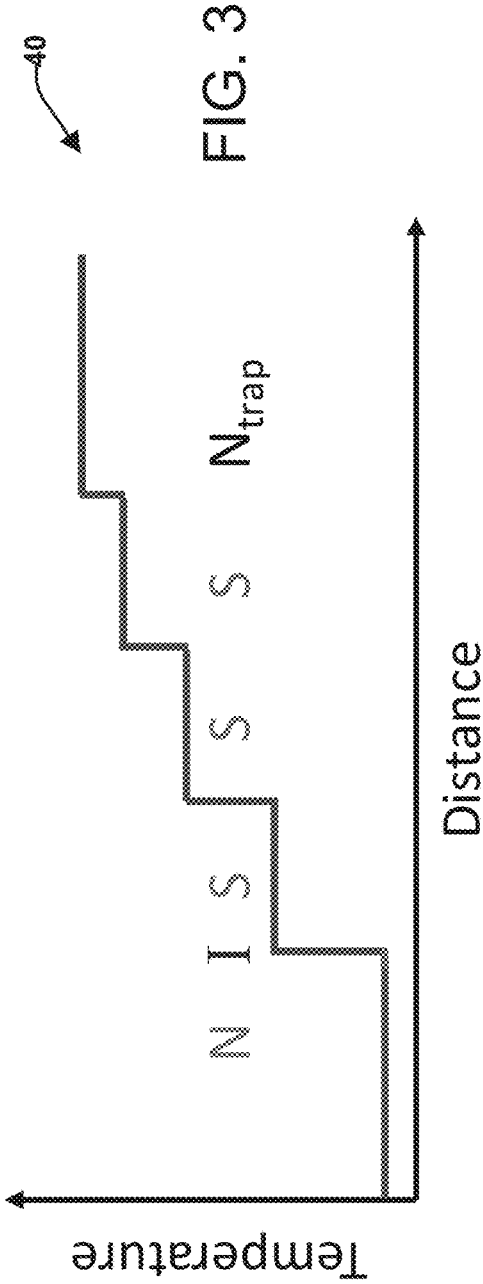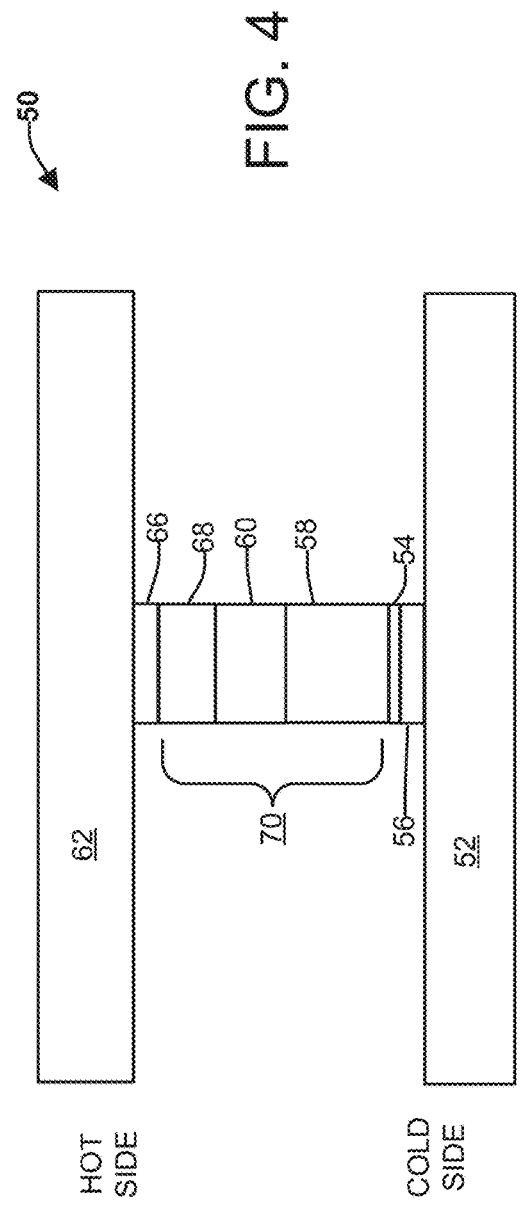

SUPERCONDUCTOR THERMAL FILTER

TECHNICAL FIELD

The present invention relates generally to superconductors, and more particularly to a superconductor thermal filter.

BACKGROUND

Solid-state electron cooling by the tunneling of "hot" electrons across a normal metal-insulator-superconductor (NIS) junction, using a bias voltage, has been proven to work below 1 K, substantially operating like the more familiar near room-temperature expensive Peltier thermoelectric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction. However, phonon heat generated in the quasiparticle trap can migrate back to the superconducting electrodes also limiting the temperature difference between the hot side and cold sides of the NISN junction solid state cooler.

SUMMARY

In one example, a superconductor thermal filter is provided that includes a normal metal layer having a first side and a second side, an insulating layer overlying the first side of the normal metal layer, and a multilayer superconductor structure having a first side overlying a side of the insulating layer opposite the side that overlies the normal metal layer. The multilayer superconductor structure comprises a plurality of superconductor layers with each superconductor layer having a smaller superconducting energy band gap than the preceding superconductor as the superconductor layers extend away from the normal metal layer. The superconductor thermal filter further comprises a normal metal layer quasiparticle trap having a first side and a second side with the first side being disposed on a second side of the multilayer superconductor structure. A bias voltage is applied between the normal metal layer and the normal metal layer quasiparticle trap to remove hot electrons from the normal metal layer through each superconductor layer of the multilayer superconductor structure to the normal metal layer quasiparticle trap.

In another example, a method is disclosed of forming a superconductor thermal filter. The method comprises providing a normal metal layer having a first side and a second side, disposing an insulating layer overlying the first side of the normal metal layer, and disposing a multilayer superconductor structure having a first side overlying a side of the insulating layer opposite the side that overlies the normal metal layer. The multilayer superconductor structure comprises a plurality of superconductor layers with each superconductor layer having a smaller superconducting energy band gap than the preceding superconductor as the superconductor layers extend away from the normal metal layer. The method further comprises disposing a normal metal layer quasiparticle trap with a first side and a second side with the first side being disposed on a second side of the multilayer superconductor structure.

BRIEF DESCRIPTION OF THE DRAWINGS

FIG. 3 illustrates a graph of temperature versus distance of the superconductor thermal filter of FIG. 1.

FIG. 4 illustrates a schematic cross-sectional view of an example of a multichip superconductor structure showing a single multilayer superconductor bump bond structure.

DETAILED DESCRIPTION

Figure 1:
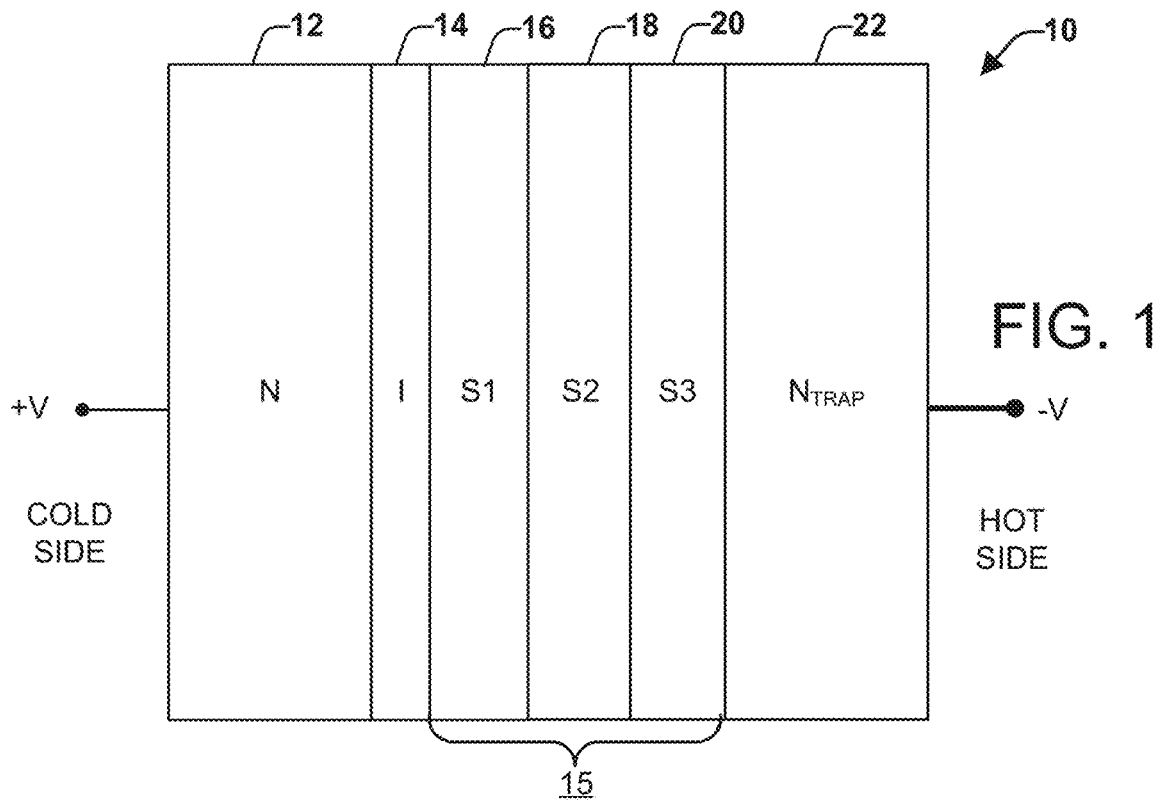
FIG. 1 illustrates an example schematic illustration of a side-view of a cross-section of a superconductor thermal filter.

The disclosure relates to a superconductor thermal filter composed of a plurality of layers of individual superconducting materials. Each superconductor layer has a smaller superconducting energy band gap than the preceding material when moving from a cold temperature side to a hot temperature side. The effect of this is that as "hot" electrons (quasiparticles) progress from one layer to another they will fall into each material with a smaller energy band gap and be unable to travel back into the larger energy band gap material. The superconductor thermal filter can be can be a normal metal-insulator-superconductor (NIS) junction device or a normal metal-insulator-superconductor-normal metal (NISN) junction device in which the superconductor portion is formed from a plurality of different superconductor layers with decreasing energy band gaps from a cold temperature side to a hot temperature side. A normal metal is a metal that does not superconduct at cryogenic operating temperatures. This superconductor thermal filter functions as a band gap filter and also serves to prevent the backwards flow of quasi particles, and phonons.

In one example, a "hot" electron and phonon filter for use with a NISN junction is disclosed. The filter is formed from a plurality of layers of superconducting material preventing the backward flow of "hot" electrons and phonons from the normal metal trap into the NIS junction. In the current state of the art there is nothing to prevent the backwards flow of quasi-particle (unpaired electron like particles in a superconductor) from a quasi-particle trap back into the superconductor. Furthermore, there is only a single thermal boundary resistance to prevent the flow of phonons passing into the superconductor. In the present examples, a plurality of superconducting material layers provide a strong bandgap thermal filter by providing multiple bandgaps that the hot electrons and interfacial thermal boundary resistance that the hot phonons need to overcome to return heat to the normal metal layer on the cold side of the superconductor thermal filter.

Phonons are quantized lattice vibrations that carry the heat in superconductors, and partially carry heat in normal metals. Normal metals will also carry heat by electrons. Each time the heat encounters a superconductor layer, the heat primarily is carried by phonons as vibrations. The vibrations have a dominant wavelength based on the specific material and its current temperature.

Superconductors can proximitize each other. Therefore a thickness greater than 4 coherence lengths is desired to ensure that the layers function correctly. There is also a thermal boundary resistance mismatch between the superconductors. This will be tuned to block the dominant phonon wavelength which will prevent phonons from the "hot" electron trap from flowing into the NIS Junction. The dominant phonon wavelength is an approximation that at any temperature the heat is predominately carried by a single frequency vmax of the phonon vibrations. The dominant phonon wavelength is then found as $\lambda_{dom}=v/v_{max}$ where v is the speed of sound. Similar to optical fibers, by choosing film layer thicknesses that are ¼ wavelength (or a multiple), a phonon filter can be setup where constructive interference at each layer minimizes the phonon heat flow.

Thermal boundary resistance, or Kapitza resistance, is a measure of an interface's resistance to thermal flow. Owing to differences in electronic and vibrational properties in different materials, when an energy carrier (phonon or electron, depending on the material) attempts to traverse the interface, it will scatter at the interface. The probability of transmission after scattering will depend on the available energy states on side 1 and side 2 of the interface.

In one example, the superconductor thermal filter can be employed to separate circuitry residing on different superconducting structures in a multi-chip device. The superconductor thermal filter can be a bump bond structure or part of a bump bond structure that also bonds two chips together in a multi-chip device. In another example, the superconductor thermal filter can be employed in a solid state cooler device that can be employed in a refrigeration system. The solid state cooler devices can form a last refrigeration stage in a plurality of refrigeration stages to provide cooling down to milliKelvin temperatures. The solid state cooler can be a NIS or a NISN device.

FIG. 1 illustrates an example schematic illustration of a side-view of a cross-section of a superconductor thermal filter 10. The superconductor thermal filter 10 can be configured as a refrigeration stage employed in a cryogenic cooling application in which the superconductor thermal cooler is configured as a solid state device that is one of a plurality of solid state cooler devices placed around a refrigeration container that resides in a vacuum and holds superconducting circuitry. The plurality of solid state devices can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. Alternatively, the superconductor thermal filter 10 can be employed as a connecting structure between two devices, such that the connecting structure is a multilayer connector or a bump bond structure.

The superconductor thermal filter 10 is a NISN device with the superconductor portion being a multilayer superconductor structure 15. The superconductor thermal filter 10 includes a normal metal layer 12 disposed on a cold side of the superconductor thermal filter 10. The normal metal layer 12 is separated from a first or cold side of the multilayer superconductor structure 15 by an insulator layer 14. A normal metal quasiparticle trap 22 is disposed on a second or hot side of the multilayer superconductor structure 15. The multilayer superconductor structure 15 includes a first superconductor layer 16 (S1) with a first energy bandgap, a second superconductor layer 18 (S2) with a second energy bandgap and a third superconductor layer (S3) with a third energy bandgap. The first energy bandgap is greater than the second energy bandgap, and the second energy bandgap is greater than the third energy bandgap.

Figure 2:
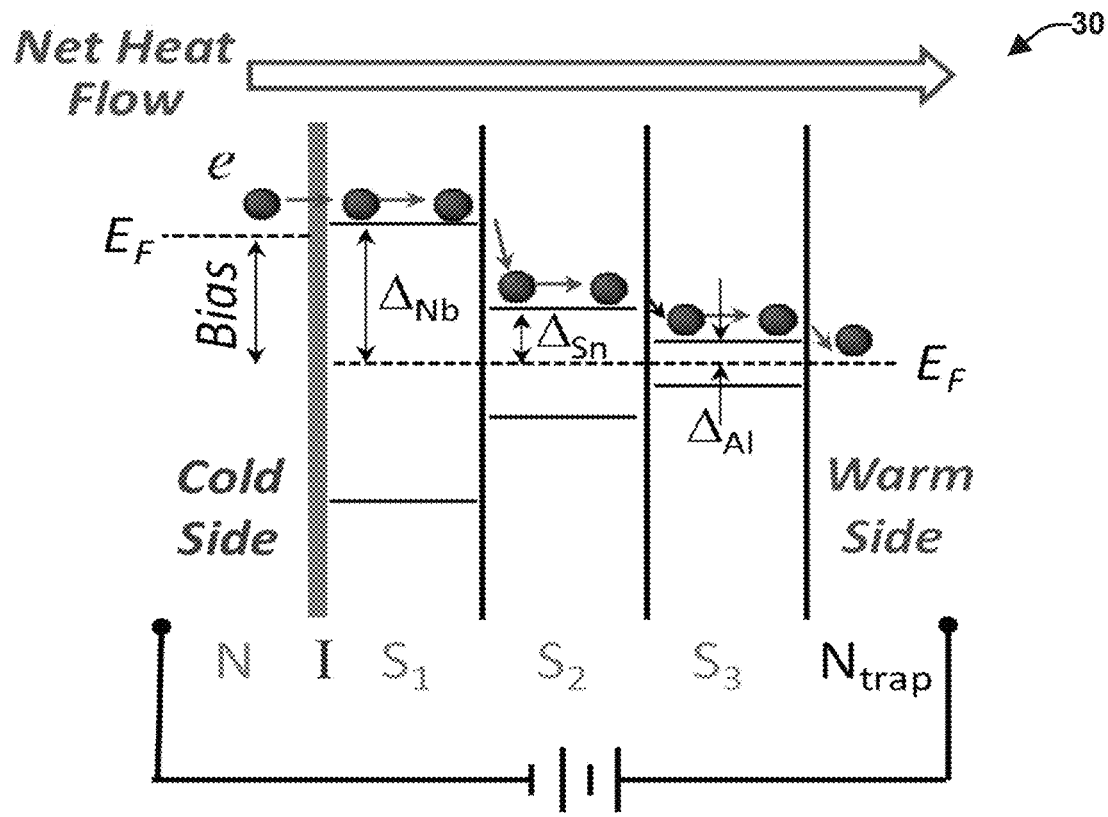
FIG. 2 illustrates a graph that shows the principle of operation and the net heat flow of the superconductor thermal filter of FIG. 1

A bias voltage (+V/−V) is applied between the normal metal layer 12 disposed on the cold side of the superconductor thermal filter 10 and the normal metal quasiparticle trap 22 disposed on the hot side of the superconductor thermal filter 10. The bias voltage (V+/−V) raises the energy level of the hot electrons on the normal metal layer 12. FIG. 2 illustrates a graph 30 that shows the principle of operation and the net heat flow of the superconductor thermal filter 10 of FIG. 1, where hot electrons in the normal metal layer 12 above the Fermi level tunnel across the insulatator layer 14 into the first superconductor layer 16, thus removing heat from the normal metal layer 12. The hot electrons then move readily to the second superconductor layer 18 since it has a lower energy bandgap that the first superconductor layer 16. These hot electrons then move readily to the third superconductor layer 20 since it has a lower energy bandgap that the second superconductor layer 18. Finally, the hot electrons move into the normal metal quasiparticle trap 22 on the hot side of the superconductor thermal filter 10. The decreasing superconducting energy gaps reduces the quasiparticle backflow, while the use of a quasiparticle trap prevents the quasi particles from reintegrating into phonons while in the superconducting material.

In one example, the first superconductor layer 16 is formed of niobium (Nb) with a superconducting energy bandgap of $2\Delta=30.5\times10^{-4}$ eV, the second superconductor layer 18 is formed of tin (Sn) with a superconducting energy bandgap of $2\Delta=11.5\times10^{-4}$ eV, and the third superconductor layer 20 is formed of aluminum (Al) with a superconducting energy bandgap of $2\Delta=3.4\times10^{-4}$ eV. In yet another example, the first superconductor layer 16 is formed of aluminum (Al) with a superconducting energy bandgap of $2\Delta=3.4\times10^{-4}$ eV, the second superconductor layer 18 is formed of molybdenum (Mo) with a superconducting energy bandgap of $2\Delta=2.7\times10^{-4}$ eV, and the third superconductor layer 20 is formed of titanium (Ti) with a superconducting energy bandgap of $2\Delta=1.2\times10^{-4}$ eV. It is to be appreciated that a variety of different superconducting material layers and a different number of superconducting material layers could be employed as long as they are selected to having progressinginly decreasing superconducting energy bandgaps from the normal metal layer 12 to the normal metal layer quasiparticle trap 22.

Each superconductor layer can be selected to have a thickness greater than 4 coherence lengths to ensure that the layers functions as a superconductor correctly. Each superconductor layer can also be selected to have a thermal boundary resistance mismatch between the interfaces of the superconductor layers. Each superconductor layer can be selected to have a film layer thickness that is ¼ wavelength (or a multiple) of its respective dominant phonon wavelength based on its operating temperature. This allows for the superconductor structure to behave as a phonon filter where constructive interference at each layer minimizes the phonon heat flow. The normal metal layers can be formed of a normal metal such as from one of gold, titanium, chromium, platinum, or another metal that is above its superconducting transition temperature or a combination thereof. The superconductor material layers can be formed of indium, niobium, tin, molybdenum, titanium, aluminum, or some other superconducting metal.

FIG. 3 illustrates a graph 40 of temperature versus distance of the superconductor thermal filter 10 of FIG. 1. The graph 40 illustrates the temperature increases through each layer of the NISN device. Each superconductor layer of the superconductor structure 15 is also selected to have a thermal boundary resistance mismatch between the interfaces of the superconductor layers. This provides for a well defined step function of temperature versus distance of the superconductor thermal filter 10 of FIG. 1.

Figure 5:
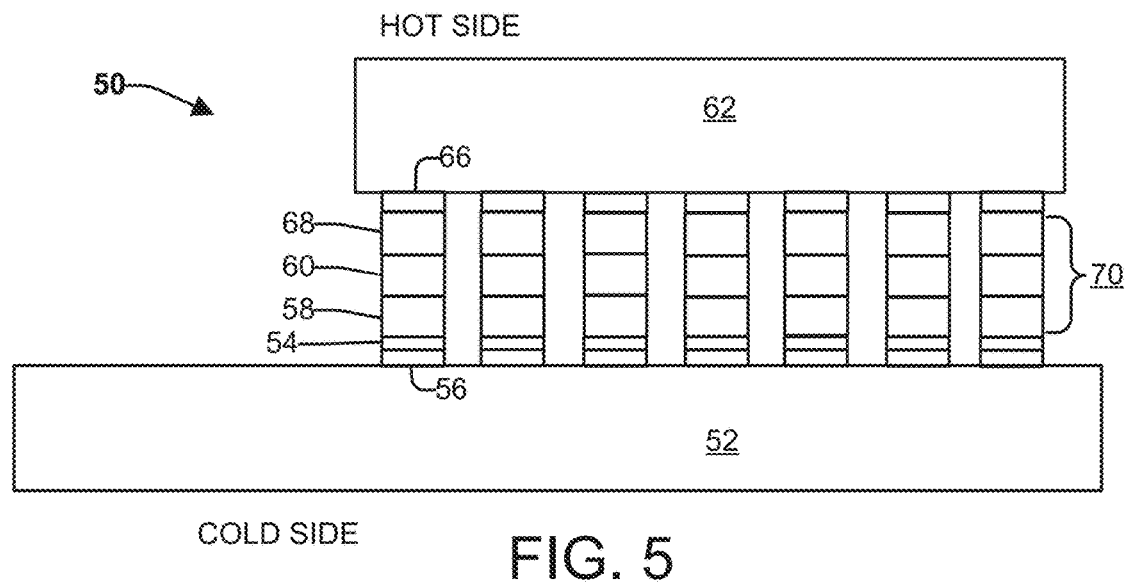
FIG. 5 illustrates a schematic cross-sectional view of the multichip superconducting structure of FIG. 4 with a plurality of the single multilayer superconductor bump bond structures.

FIG. 4 illustrates a schematic cross-sectional view of an example of a multichip superconductor structure 50 showing a single multilayer superconductor bump bond structure 70, while FIG. 5 shows the multichip superconducting structure 50 with a plurality of the single multilayer superconductor bump bond structures 70. The multichip superconducting structure 50 includes a first superconducting device 52 (e.g., bottom device or main device) connected to a second superconducting device 62 (e.g., top device or auxiliary device), through the plurality of multilayer superconductor bump bond structures 70. A multichip superconductor structure could include multiple superconductor devices connected to another superconductor device. A superconductor device can be a substrate wafer, a package device for passing signals to another device, an integrated circuit (IC), or a variety of other types of superconductor devices.

The first superconductor device 52 includes a plurality of first normal metal contact pads 56 disposed at or near a top side of the first superconductor device 52. The second superconductor device 62 includes a plurality of second normal metal contact pads 66 disposed at or near a bottom side of the second superconductor device 62. The first superconductor device 52 is electrically and mechanically coupled to the second superconductor device 62 by the plurality of multilayer superconducting bump bond structures 70 that bond the devices to one another through corresponding normal metal contact pads of the first and second superconductor devices 52 and 62, respectively. An insulating layer 54 resides between each of the plurality of first normal metal contact pads 56 and the corresponding multilayer superconducting bump bond structure 70. The multilayer superconducting bump bond structure 70 along with the insulating layer 54 and the normal metal contact pads 56 and 66 form a NISN device that acts as a superconductor thermal filter between the chips by utilizing a multilayer superconducting bump bond structure formed of a superconducting layers with decreasing energy bandgaps from a cold-side to a hot-side of the device 50. Although, the normal metal contact pads and the insulating layers are shown as residing above the superconducting devices, they could reside within the superconducting devices.

Each multilayer superconducting bump bond structure 70 includes a first superconductor layer 58 with a first energy bandgap, a second superconductor layer 60 with a second energy bandgap and a third superconductor layer 68 with a third energy bandgap. The first energy bandgap is greater than the second energy bandgap, and the second energy bandgap is greater than the third energy bandgap. The plurality of first normal metal contact pads 56 reside on a cold side of the multichip superconductor structure 50, while the plurality of second normal metal contact pads 66 reside on a hot side of the multichip superconductor structure 50. Furthermore, the superconducting metal material of the first, second and third superconductor metal layers 20 are selected to provide a good thermal boundary resistance at each superconductor material layer interface to inhibit the flow of heat. The thickness of each metal layer can be selected to be greater than a thickness of at least 4 coherence lengths of the type of superconducting metal in the superconductor metal layer to assure that the superconductor metal layer retains its superconducting properties. Each superconductor layer can be selected to have a film layer thickness that is ¼ wavelength (or a multiple) of its respective dominant phonon wavelength based on its operating temperature.

Figure 6:
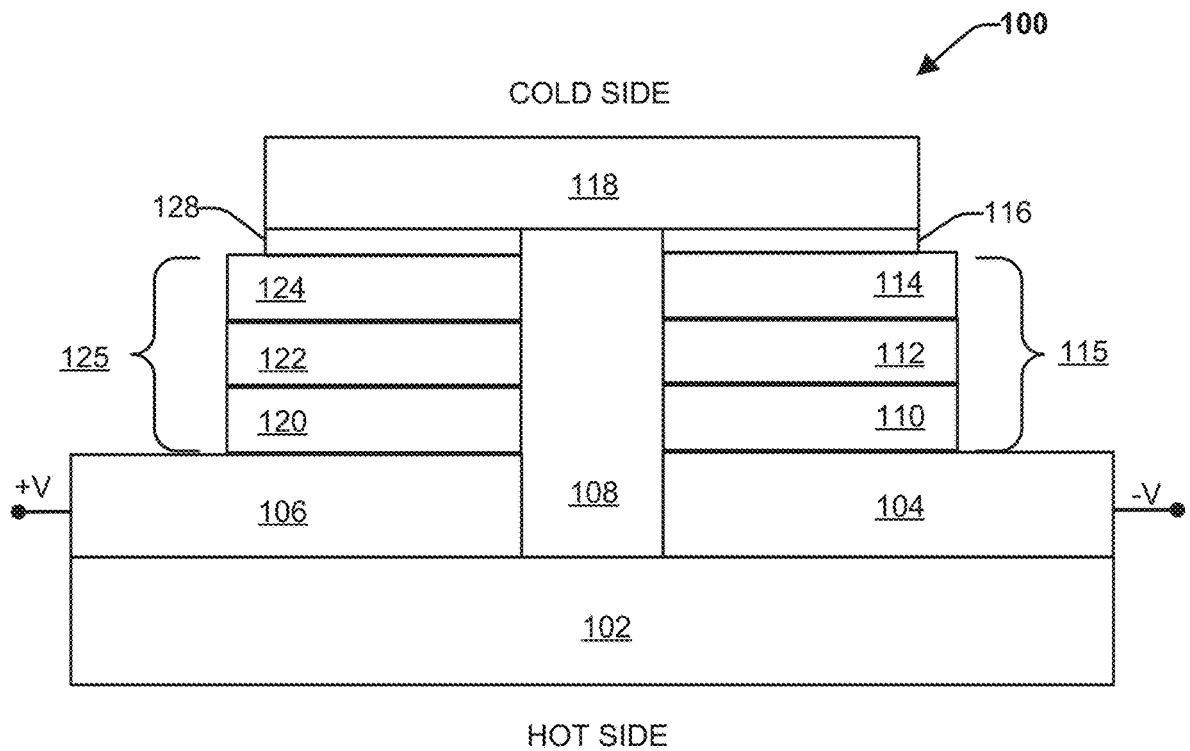
FIG. 6 illustrates a schematic cross-sectional view of an example of a solid state cooler device that employs a superconductor thermal filter.

FIG. 6 illustrates a schematic cross-sectional view of an example of a solid state cooler device 100 that employs a superconductor thermal filter. The solid state cooler device 100 can be configured as a refrigeration stage employed in a cryogenic cooling application in which the solid state structure is one of a plurality of solid state cooler devices disposed about a refrigeration container that resides in a vacuum and holds superconducting circuitry. The plurality of solid state structures can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. The solid state cooler device can include a NIS junction or a NISN junction. The return of heat extracted from the cold side of the solid state cooler device is mitigated by employing a multilayer superconductor structure having superconductor layers of decreasing bandgaps from the cold side to the hot side.

As illustrated in FIG. 6, the solid state cooler device 100 includes a substrate 102 that is disposed on a hot side of a refrigeration stage. A first conductive pad 104 is disposed on the substrate 102, and a second conductive pad 106 is disposed on the substrate 102. The first conductive pad 104 is spaced apart from the second conductive pad 106 by a gap 108. A first multilayer superconductor structure 115 includes a first side (or cold side) configured to face the cold side of the refrigerator stage and a second side (or hot side) configured to face the hot side of the refrigeration stage. The second side of the first multilayer superconductor structure 115 is disposed on and in contact with the first conductive pad 104. A second multilayer superconductor structure 125 includes a first side facing the cold side of the refrigeration stage, and a second side facing the hot side of the refrigeration stage. The second side of the second multilayer superconductor structure 125 is disposed on and in contact with the second conductive pad 106.

The first multilayer superconductor structure 115 includes a first superconductor layer 114 with a first energy bandgap, a second superconductor layer 112 with a second energy bandgap and a third superconductor layer 110 with a third energy bandgap. The first energy bandgap is greater than the second energy bandgap, and the second energy bandgap is greater than the third energy bandgap. The second multilayer superconductor structure 125 includes a fourth superconductor layer 124 with a fourth energy bandgap, a fifth superconductor layer 122 with a fifth energy bandgap and a sixth superconductor layer 120 with a sixth energy bandgap. The fourth energy bandgap is greater than the fifth energy bandgap, and the fifth energy bandgap is greater than the sixth energy bandgap.

A first insulating layer 116 is disposed between a surface of the first side of first multilayer superconductor structure 115, and a first end of a normal metal layer 118, and a second insulating layer 128 is disposed between a surface of the first side of the second multilayer superconductor structure 125, and a second end of the normal metal layer 118. A bias voltage is applied between the first conductive pad 104 and the second conductive pad 106 to remove hot electrons from the normal metal layer 118. The bias voltage raises the energy level of the hot electrons on the normal metal layer 118. The first conductive pad 104 and the second conductive pad 106 can be formed from a normal metal or a superconducting metal. The first conductive pad 104 and the second conductive pad 106 act as a quasi-particle trap when formed of a normal metal.

The normal metal layers can be formed of a normal metal such as from one of gold, titanium, chromium, platinum, or another metal that is above its superconducting transition temperature or a combination thereof. The superconductor material layers can be formed of indium, niobium, tin, molybdenum, titanium, aluminum, or some other superconducting metal.

Figure 7:
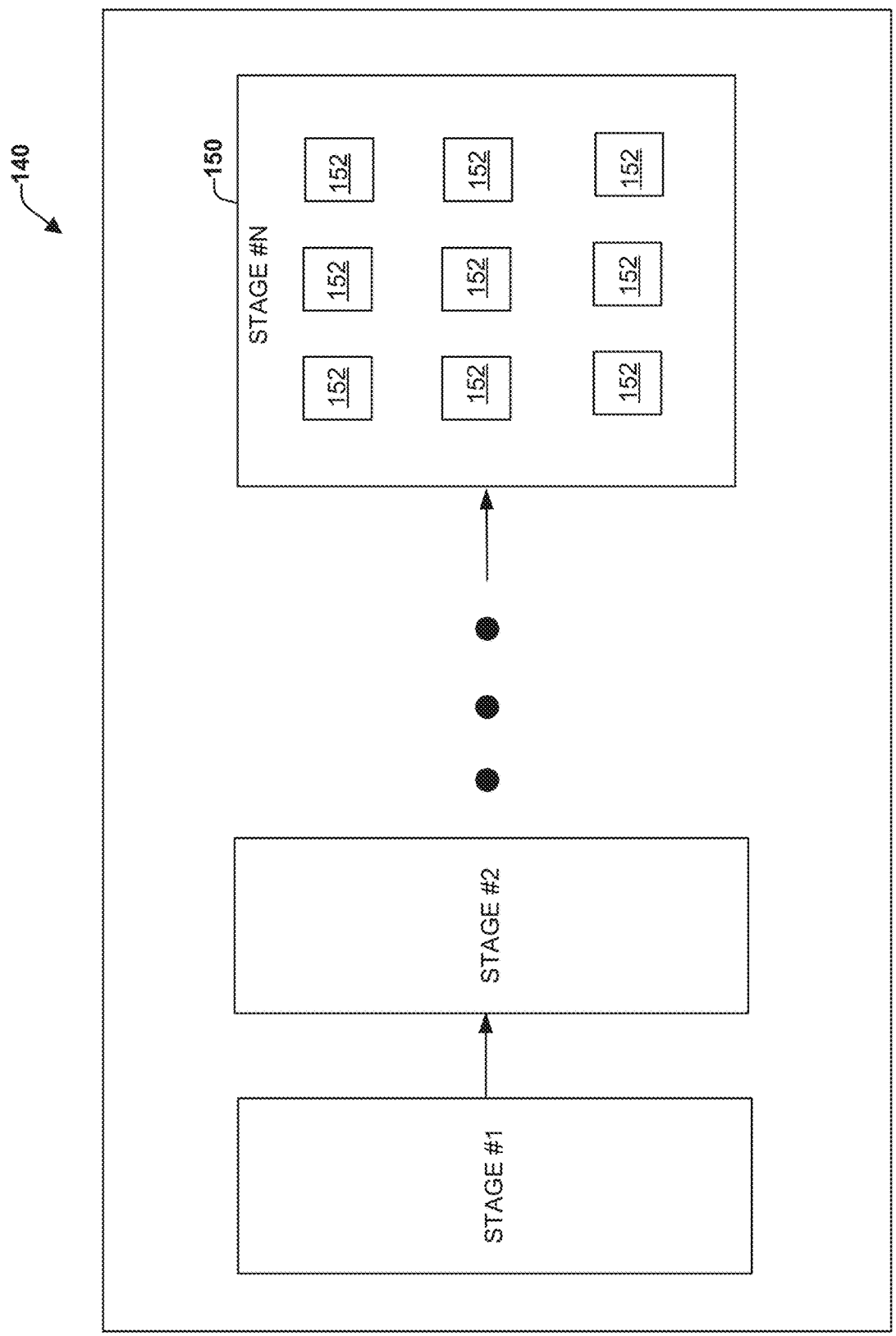
FIG. 7 illustrates a block diagram of a refrigeration system that employs solid state devices such as the solid state device of FIG. 6.

FIG. 7 illustrates a block diagram of a refrigeration system 140 that employs solid state devices such as the solid state device 100 of FIG. 6. The refrigeration system 140 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 140. In other examples, the Nth stage is a first or intermediary stage as opposed to the last stage. Stage #N in the refrigeration system 140 includes a refrigeration container 150 with a plurality of solid state devices 152 similar to that illustrated in FIG. 6 disposed about the container and cooperating to provide the final lowest temperature of the refrigeration system 140 within the container 150. The container 150 can be in a vacuum environment and be configured to house superconducting circuitry. In another example, one or more of the other stages employ solid state devices similar to those in stage #N to provide incremental temperature drops across the refrigeration system 140. In other examples, the refrigeration container 150 can be formed of a normal metal that provides the final normal metal layer of each solid state device 152.

Figure 8:
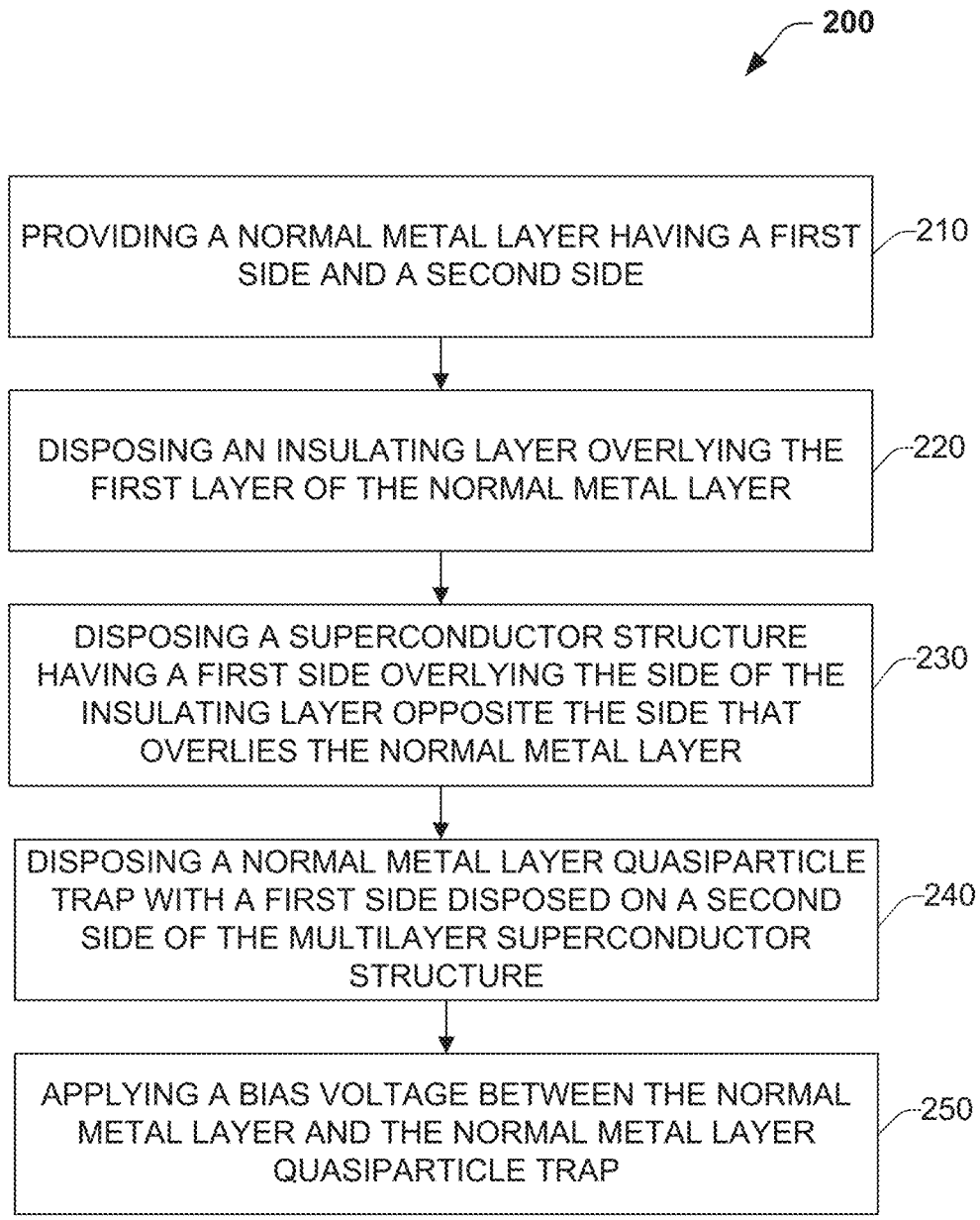
FIG. 8 illustrates a method of forming a superconductor thermal filter.

FIG. 8 illustrates an example of a method 200 for providing a superconductor thermal filter. At 210, a normal metal layer is provided having a first side and a second side. At 220, an insulating layer is disposed overlying the first side of the normal metal layer. At 230, a multilayer superconductor structure is disposed having a first side overlying a side of the insulating layer opposite the side that overlies the normal metal layer. The multilayer superconductor structure includes a plurality of superconductor layers with each superconductor layer having a smaller superconducting energy band gap than the preceding superconductor as the superconductor layers extend away from the normal metal layer. At 240, a normal metal layer quasiparticle trap is disposed with a first side disposed on a second side of the multilayer superconductor structure. Next, at 250, a bias voltage is applied between the normal metal layer and the normal metal layer quasiparticle trap to remove hot electrons from the normal metal layer through each superconductor layer of the multilayer superconductor structure to the normal metal layer quasiparticle trap.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A superconductor thermal filter comprising:
   a normal metal layer having a first side and a second side;
   an insulating layer overlying the first side of the normal metal layer;
   a multilayer superconductor structure having a first side overlying a side of the insulating layer opposite the side that overlies the normal metal layer, the multilayer superconductor structure comprised of a plurality of superconductor layers with each superconductor layer having a smaller superconducting energy band gap than the preceding superconductor as the superconductor layers extend away from the normal metal layer; and
   a normal metal layer quasiparticle trap having a first side and a second side, the first side being disposed on a second side of the multilayer superconductor structure;
   wherein a bias voltage is applied between the normal metal layer and the normal metal layer quasiparticle trap to remove hot electrons from the normal metal layer through each superconductor layer of the multilayer superconductor structure to the normal metal layer quasiparticle trap.

2. The superconductor thermal filter of claim 1, wherein the multilayer superconductor structure comprises a first superconductor layer with a first energy bandgap, a second superconductor layer with a second energy bandgap and a third superconductor layer with a third energy bandgap, such that the first energy bandgap is greater than the second energy bandgap, and the second energy bandgap is greater than the third energy bandgap.

3. The superconductor thermal filter of claim 2, wherein the first superconducting layer is formed of niobium (Nb) with a superconducting energy bandgap of $2\Delta=30.5\times10^{-4}$ eV, the second superconducting layer is formed of tin (Sn) with a superconducting energy bandgap of $2\Delta=11.5\times10^{-4}$ eV, and the third superconducting layer is formed of aluminum (Al) with a superconducting energy bandgap of $2\Delta=3.4\times10^{-4}$ eV.

4. The superconductor thermal filter of claim 2, wherein the first superconductor layer is formed of aluminum (Al) with a superconducting energy bandgap of $2\Delta=3.4\times10^{-4}$ eV, the second superconductor layer is formed of molybdenum (Mo) with a superconducting energy bandgap of $2\Delta=2.7\times10^{-4}$ eV, and the third superconducting layer is formed of titanium (Ti) with a superconducting energy bandgap of $2\Delta=1.2\times10^{-4}$ eV.

5. The superconductor thermal filter of claim 1, wherein each of the plurality of superconductor layers have a thickness thicker than 4 coherence lengths associated with the respective superconductor of the respective superconductor layer.

6. The superconductor thermal filter of claim 1, wherein each of the plurality of superconductor layers are selected to have a thermal boundary resistance mismatch between the interfaces of adjoining superconductor layers.

7. The superconductor thermal filter of claim 1, wherein at least one of the plurality of superconducting layers have a film layer thickness that is ¼ wavelength or a multiple of a ¼ wavelength of the dominant phonon associated with the operating temperature of the respective at least one superconductor layers.

8. A solid state cooler comprising the superconductor thermal filter as claimed in claim 1.

9. A multichip device comprising a first device coupled to a second device by at least a portion of the superconductor thermal filter as claimed in claim 1.

10. A refrigeration system comprising a plurality of refrigeration stages, wherein at least one stage of the refrigeration system comprises a refrigeration container and a plurality of superconductor thermal filters as claimed in claim 1 disposed about the refrigeration container.

11. The superconductor thermal filter of claim 1, wherein exposing the second side of the normal metal layer quasiparticle trap to a first environment at a first temperature holds a second environment on the second side of the normal metal layer to a second temperature that is less than the first temperature.

12. A method of forming a superconductor thermal filter, the method comprising:
providing a normal metal layer having a first side and a second side;
disposing an insulating layer overlying the first side of the normal metal layer;
disposing a multilayer superconductor structure having a first side overlying a side of the insulating layer opposite the side that overlies the normal metal layer, the multilayer superconductor structure comprised of a plurality of superconductor layers with each superconductor layer having a smaller superconducting energy band gap than the preceding superconductor as the superconductor layers extend away from the normal metal layer; and
disposing a normal metal layer quasiparticle trap with a first side and a second side, the first side being disposed on a second side of the multilayer superconductor structure.

13. The method of claim 12, further comprising applying a bias voltage between the normal metal layer and the normal metal layer quasiparticle trap to remove hot electrons from the normal metal layer through each superconductor layer of the multilayer superconductor structure to the normal metal layer quasiparticle trap.

14. The method of claim 12, wherein the multilayer superconductor structure comprises a first superconductor layer with a first energy bandgap, a second superconductor layer with a second energy bandgap and a third superconductor layer with a third energy bandgap, such that the first energy bandgap is greater than the second energy bandgap, and the second energy bandgap is greater than the third energy bandgap.

15. The method of claim 14, wherein the first superconducting layer is formed of niobium (Nb) with a superconducting energy bandgap of $2\Delta=30.5\times10^{-4}$ eV, the second superconducting layer is formed of tin (Sn) with a superconducting energy bandgap of $2\Delta=11.5\times10^{-4}$ eV, and the third superconducting layer is formed of aluminum (Al) with a superconducting energy bandgap of $2\Delta=3.4\times10^{-4}$ eV.

16. The method of claim 14, wherein the first superconductor layer is formed of aluminum (Al) with a superconducting energy bandgap of $2\Delta=3.4\times10^{-4}$ eV, the second superconductor layer is formed of molybdenum (Mo) with a superconducting energy bandgap of $2\Delta=2.7\times10^{-4}$ eV, and the third superconducting layer is formed of titanium (Ti) with a superconducting energy bandgap of $2\Delta=1.2\times10^{-4}$ eV.

17. The method of claim 12, wherein each of the plurality of superconductor layers have a thickness thicker than 4 coherence lengths associated with the respective superconductor of the respective superconductor layer.

18. The method of claim 12, wherein each of the plurality of superconductor layers are selected to have a thermal boundary resistance mismatch between the interfaces of adjoining superconductor layers.

19. The method of claim 12, wherein at least one of the plurality of superconducting layers have a film layer thickness that is ¼ wavelength or a multiple of a ¼ wavelength of the dominant phonon associated with the operating temperature of the at least one superconductor layers.

20. The method of claim 12, further comprising exposing the second side of the normal metal layer quasiparticle trap to a first environment at a first temperature, wherein the second side of the normal metal layer has a second environment that is held at a second temperature that is less than the first temperature.

\* \* \* \* \*